US012189974B2

United States Patent
Boehm et al.

(10) Patent No.: US 12,189,974 B2
(45) Date of Patent: Jan. 7, 2025

(54) OPERATIONAL MONITORING FOR MEMORY DEVICES

(71) Applicant: Micron Technology, Inc., Boise, ID (US)

(72) Inventors: Aaron P. Boehm, Boise, ID (US); Todd J. Plum, Boise, ID (US); Scott D. Van De Graaff, Boise, ID (US); Scott E. Schaefer, Boise, ID (US); Mark D. Ingram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 17/345,267

(22) Filed: Jun. 11, 2021

(65) Prior Publication Data
US 2021/0397363 A1 Dec. 23, 2021

Related U.S. Application Data

(60) Provisional application No. 63/040,337, filed on Jun. 17, 2020.

(51) Int. Cl.
*G06F 3/06* (2006.01)
*G06F 1/06* (2006.01)

(52) U.S. Cl.
CPC .............. *G06F 3/0653* (2013.01); *G06F 1/06* (2013.01); *G06F 3/0625* (2013.01); *G06F 3/0655* (2013.01); *G06F 3/0679* (2013.01)

(58) Field of Classification Search
CPC ...... G06F 1/06; G06F 11/008; G06F 11/0793; G06F 11/3037; G06F 11/3058;

(Continued)

(56) References Cited

U.S. PATENT DOCUMENTS 5,943,297 A * 8/1999 Baker ................. G06F 1/14
708/111
8,910,310 B2 * 12/2014 Chyan ................. G06F 21/70
257/738

(Continued)

OTHER PUBLICATIONS

Wikipedia, "MultiMediaCard", 2019, The Wayback Machine, as preserved by the Internet Archive on Jun. 7, 2019, pp. 1-6 web.archive.org/web/20190607111259/https://en.wikipedia.org/wiki/MultiMediaCard (Year: 2019).*

(Continued)

*Primary Examiner* — Curtis James Kortman
(74) *Attorney, Agent, or Firm* — Holland & Hart LLP

(57) ABSTRACT

Methods, systems, and devices for operational monitoring for memory devices are described. Some memory devices may degrade over time, and this degradation may include or refer to a reduction of an ability of the memory device to reliably store, read, process, or communicate information, among other degradation. In accordance with examples as disclosed herein, a memory device may include components configured for monitoring health or life expectancy or both of the memory device, such as components internal to the memory device that identify and store various indications of a duration of operating a memory device. An operational duration stored at the memory device may be used in various operations, such as calculations or comparisons, to evaluate health or life expectancy of the memory device, which may include or be supported by various signaling with a host device.

22 Claims, 8 Drawing Sheets

(58) Field of Classification Search
CPC ............. G06F 11/3089; G06F 11/3409; G06F 11/3466; G06F 2201/81; G06F 2201/88; G06F 2212/1032; G06F 2212/1036; G06F 2212/7204; G06F 2212/7208; G06F 3/0616; G06F 3/0619; G06F 3/0625; G06F 3/0634; G06F 3/0653; G06F 3/0655; G06F 3/0679; G11C 11/4076; G11C 11/4078; G11C 2029/0409; G11C 29/12; G11C 29/50; G11C 7/1063; G11C 7/20; G11C 7/222

See application file for complete search history.

(56) References Cited

U.S. PATENT DOCUMENTS

| | | |
|---|---|---|
| 10,108,354 B2 | 10/2018 | Lee et al. |
| 10,114,584 B2 | 10/2018 | Gorobets et al. |
| 10,613,781 B2 | 4/2020 | Melik-martirosian |
| 2007/0263444 A1 | 11/2007 | Gorobets et al. |
| 2013/0198574 A1* | 8/2013 | Higley ................ G06F 11/0727 714/45 |
| 2014/0040701 A1* | 2/2014 | Igari ................... G06F 11/1008 714/764 |
| 2014/0173268 A1* | 6/2014 | Hashimoto ........... G06F 3/0652 713/2 |
| 2016/0139982 A1* | 5/2016 | Yu ....................... G06F 12/0246 714/768 |
| 2017/0104663 A1* | 4/2017 | Thakur ................ G06F 3/0665 |
| 2019/0012098 A1 | 1/2019 | Hashimoto |
| 2019/0051363 A1* | 2/2019 | Raasch ..................... G06F 9/50 |
| 2019/0130979 A1* | 5/2019 | Jean ........................ G11C 7/04 |
| 2019/0227725 A1* | 7/2019 | Afriat .................... G06F 3/0625 |
| 2019/0347035 A1* | 11/2019 | Hasbun ................. G06F 3/0679 |
| 2020/0065528 A1* | 2/2020 | Ogawa ................. G06F 3/0679 |
| 2020/0117534 A1* | 4/2020 | Yurzola ................. G06F 3/0619 |
| 2020/0174866 A1* | 6/2020 | Ayyapureddi ......... H10B 20/20 |
| 2022/0028829 A1* | 1/2022 | Cheng ..................... H01L 21/78 |
| 2022/0058293 A1* | 2/2022 | Troia ..................... H04L 9/3263 |

OTHER PUBLICATIONS

ISA/KR, International Search Report and Written Opinion of the International Searching Authority, Int'l Appl. No. PCT/US2021/037264, Oct. 1, 2021, Korean Intellectual Property Office, Seo-gu, Daejeon, Republic of Korea, 12 pgs.

* cited by examiner

OPERATIONAL MONITORING FOR MEMORY DEVICES

CROSS REFERENCE

The present Application for Patent claims priority to U.S. Provisional Patent Application No. 63/040,337 by Boehm et al., entitled "OPERATIONAL MONITORING FOR MEMORY DEVICES" filed Jun. 17, 2020, which is assigned to the assignee hereof, and is expressly incorporated by reference in its entirety.

BACKGROUND

The following relates generally to one or more systems for memory and more specifically to operational monitoring for memory devices.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
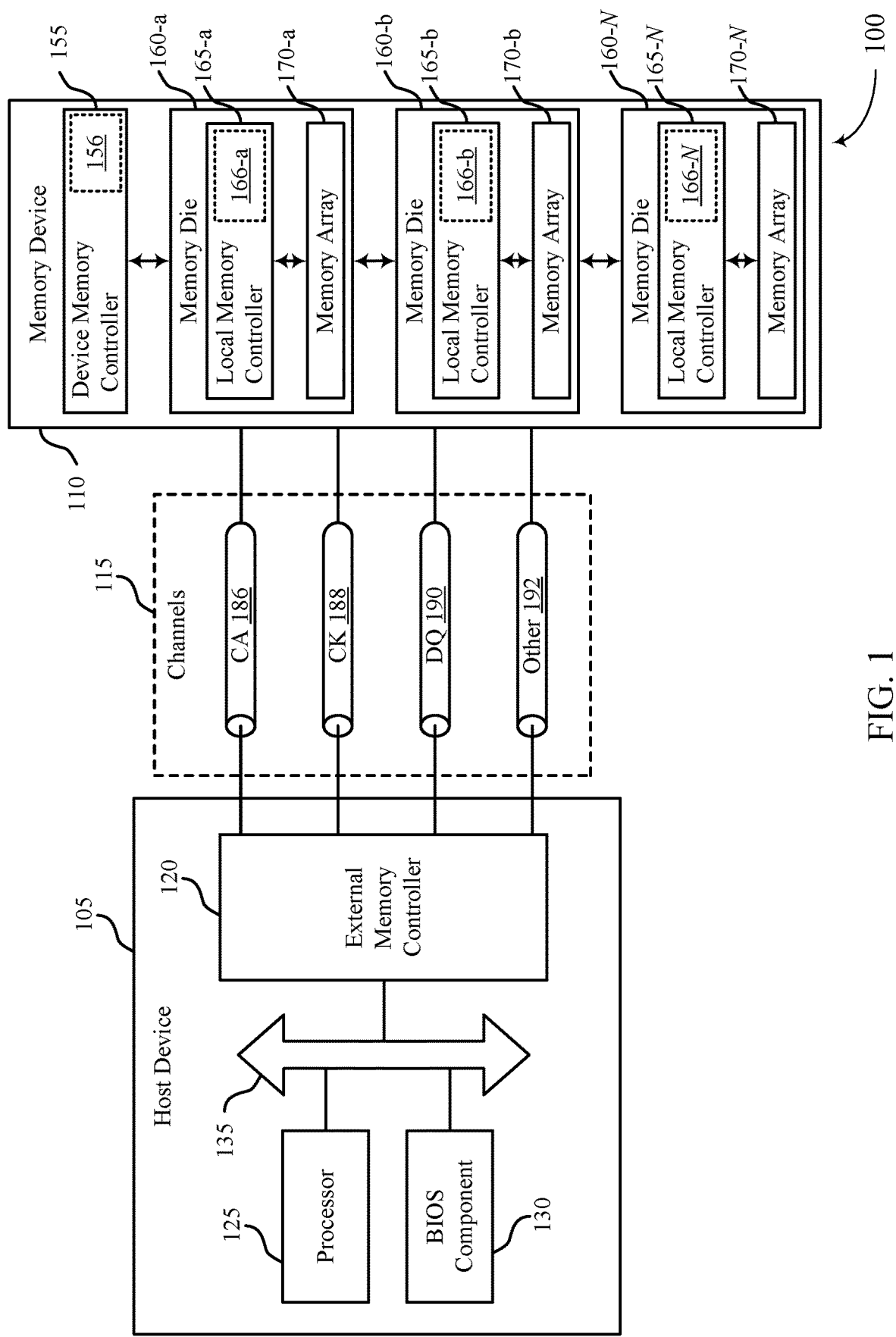
FIG. 1 illustrates an example of a system that supports operational monitoring for memory devices in accordance with examples as disclosed herein.

A memory system in accordance with examples disclosed herein may include a memory device and a host device coupled with the memory device. Reliability of a memory device in such a system may be based on likelihood, for example a statistical probability, of failures at the memory device, which may be referred to as a failure in time (FIT), or other terminology. Some applications, such as vehicle safety systems, autonomous vehicle systems, advanced driver assistance systems (ADAS) or other safety-critical systems, may have particularly high reliability requirements, or may otherwise involve a particularly low probability of failures.

In some memory systems, reliability may be improved when failures are identified, detected, or otherwise proactively handled. For example, if a memory device experiences one hundred failures in a given duration (e.g., a FIT of 100), but all of the errors are handled without operational failure (e.g., where all the errors are handled by an error correction algorithm), the memory device may be associated with a zero FIT (e.g., a zero "Safety FIT") or other measure of relatively high reliability (e.g., zero parts-per-million (PPM)). In other words, a memory device that employs techniques for reducing uncertainties associated with failures or identifies precursors of and thus takes a proactive approach with respect to such failures or reliability issues, may have a favorable reliability compared to a memory device that does not employ such techniques.

Some memory devices may degrade over time, where this degradation may include a reduction of an ability to reliably store information, a reduction of an ability to reliably read information, a reduction of an ability to process information, or a reduction of an ability to communicate information, among other degradation, or some combination thereof. Degradation of a memory device may be associated with a cumulative duration of being powered, a cumulative duration over which a memory array is accessed, a cumulative duration over which an operating parameter (e.g., temperature, voltage, access rate) satisfies a threshold, and other durations. For example, over time, memory cells or associated components or circuitry of a memory device may experience dielectric breakdown, ion or other constituent material migration or transformation, thermal stress or damage, mechanical stress or damage, fatigue, or other changes that affect operational reliability of a memory device.

In accordance with examples as disclosed herein, a memory device may include various components configured for monitoring health or life expectancy (or both) of the memory device. Such monitoring may include or involve components internal to the memory device that identify and store various indications of a duration of operating a memory device (e.g., a duration that the memory device has been powered on and operating). In some examples, the memory device may perform internal operations (e.g., calculations or comparisons) of a stored duration to duration thresholds, such as a life expectancy threshold, to evaluate health or life expectancy of the memory device, and the memory device may provide related indications to a host device. In some examples, the memory device may signal operating durations to a host device, and the host device may perform operations (e.g., calculations or comparisons, which may be related to life expectancy thresholds) external to the memory device to evaluate health or life expectancy of the memory device. By supporting these and other evaluations related to operational durations of a memory device, an associated system may support various proactive measures to maintain operational reliability, including indicating that a memory device should be replaced, modifying operation of an aging memory device, or selecting a different memory device for operations, among other actions.

Features of the disclosure are initially described in the context of systems and dies as described with reference to FIGS. 1 and 2. Features of the disclosure are described in the context of systems and operations as described with reference to FIGS. 3-4. These and other features of the disclosure are further illustrated by and described with reference to an apparatus diagram and flowcharts that relate to operational monitoring for memory devices as described with reference to FIGS. 5-8.

FIG. 1 illustrates an example of a system 100 that supports operational monitoring for memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100 (e.g., by the host device 105). In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. The memory device 110 (e.g., the device memory controller 155, one or more memory dies 160, one or more local memory controllers 165, one or more memory arrays 170) may be configured to operate in response to commands from the host device 105 (e.g., from the external memory controller 120, from the processor 125).

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. For example, the channels 115 may be an example of a physical or logical interface with or between a host device 105 (e.g., an external memory controller 120, a processor 125) and a memory device 110 (e.g., a device memory controller 155, one or more memory dies 160, one or more local memory controllers 165, one or more memory arrays 170).

Each channel 115 may be an example of a transmission medium that carries information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any number of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

In some examples, physical or operational aspects of the memory device 110 may degrade over time, and this degradation may be associated with a reduction of an ability to reliably store information (e.g., at a memory array 170), a reduction of an ability to reliably read information (e.g., from a memory array 170), a reduction of an ability to process information (e.g., at a local memory controller 165, at a device memory controller 155), or a reduction of an ability to communicate information (e.g., within the memory device 110, between the memory device 110 and the host device 105), among other issues. Degradation of the memory device 110 may be associated with a cumulative duration of being powered (e.g., the memory device 110 being powered by the host device 105 via a power supply interface, one or more memory dies 160 being powered by the device memory controller 155), a cumulative duration over which one or more memory arrays 170 is accessed, a cumulative duration over which an operating parameter (e.g., a temperature of the memory device 110 or one or more memory dies 160, a voltage of the memory device 110 or one or more memory dies 160, a moisture or humidity level of an environment while operating the memory device or one or more memory dies 160, an access rate, or other parameter of the memory device 110 or a memory die 160) satisfies a threshold, and other durations or conditions. For example, over time, memory cells of a memory array 170 or associated components or circuitry of the memory device 110 or one or more memory dies 160 may experience dielectric breakdown, ion or other constituent material migration or transformation, thermal stress or damage, mechanical stress or damage, fatigue, or other changes that affect operational reliability of the memory device 110.

In accordance with examples as disclosed herein, the memory device 110 (e.g., the device memory controller 155, one or more memory dies 160) may include various components (e.g., logic, circuitry) configured for monitoring health and life expectancy of the memory device 110. Such monitoring may include or involve components internal to the memory device 110, such as a monitoring circuit 156 of a device memory controller 155, one or more monitoring circuits 166 of one or more local memory controllers 165, or various combinations thereof, that identify and store various indications of a duration of operating the memory device 110, among other indications.

In some examples, such components may include counters or other circuits or logic to determine various operational durations, such as device-level durations (e.g., at a monitoring circuit 156), or die-level durations (e.g., at a monitoring circuit 166), or any combination thereof. An operational duration may refer to a duration that is accumulated over time or over multiple power cycles (e.g., a life-time duration, a duration over the life of a memory device 110 or memory die 160 that an operational parameter has satisfied a threshold), or is accumulated by instance (e.g., a duration of a power cycle instance, a particular duration over which a temperature, voltage, or environmental moisture or humidity satisfies a threshold, which may be stored separately from another such duration or instance, and may or may not be associated with a timestamp). In some examples, monitoring circuits 156 or monitoring circuits 166 may include sensors or monitors for detecting operating parameters (e.g., a temperature sensor, a voltage sensor, a humidity or moisture sensor, an access rate or row hammer sensor), or monitoring circuits 156 or monitoring circuits 166 may receive such information from another component (e.g., of the memory device 110, of a host device 105). Such information may be used to evaluate operating parameters at the memory device 110 and support accumulating durations over which an operating parameter satisfies a threshold. Additionally or alternatively, such information may support a component of the memory device 110 tracking or identifying an immediate or instantaneous violation, such as an overvoltage condition, an excessive temperature condition, an excessive access rate or row hammer condition, or an excessive moisture or humidity condition, and storing an indication of an instance of such a violation by setting a flag (e.g., indicating a presence of such a violation), or incrementing a counter of operating condition violations (e.g., tracking a quantity of such violations), among other techniques, which may or may not be associated with or otherwise correspond to a stored duration of such a violation.

In some examples, the memory device 110 (e.g., a monitoring circuit 156, a monitoring circuit 166) may include a non-volatile storage component for storing indications of operating durations of the memory device 110, which may include or refer to a storage component that is included in or separate from the memory arrays 170 of the memory device 110. In various examples, such a non-volatile storage component may be physically coupled with or otherwise attached to a same substrate as a memory array 170 or a memory die 160 (e.g., a same chip or other semiconductor substrate), or a same substrate as the memory device 110 (e.g., a same printed circuit board (PCB) or other memory module, such as a substrate of a dual in-line memory module (DIMM)).

In some examples, the memory device 110 (e.g., the device memory controller 155, a monitoring circuit 156, one or more local memory controllers 165, one or more monitoring circuits 166) may perform internal operations using a stored duration, such as calculations or comparisons to duration thresholds, to evaluate health or life expectancy of the memory device 110, and the memory device 110 may provide related indications to a host device 105 (e.g., via channels 115). In some examples, the memory device 110 may provide operating durations to the host device 105 (e.g., based on proactive signaling, based on responding to polling or other requests from the host device 105), and the host device 105 (e.g., the external memory controller 120, the processor 125) may perform calculations or comparisons external to the memory device 110 to evaluate health or life expectancy of the memory device 110 (e.g., based on one or more operating durations determined or stored at the memory device 110 and signaled to the host device 105). By supporting these and other evaluations related to operational durations of the memory device 110, the system 100 may support various proactive measures to maintain operational reliability, including indicating that the memory device 110 should be replaced, modifying operation (e.g., timing parameters, voltage parameters, access rates) of an aging memory device 110, or selecting a different memory device 110 or memory die 160 of the same or different memory device 110 for various data storage or access operations.

Figure 2:
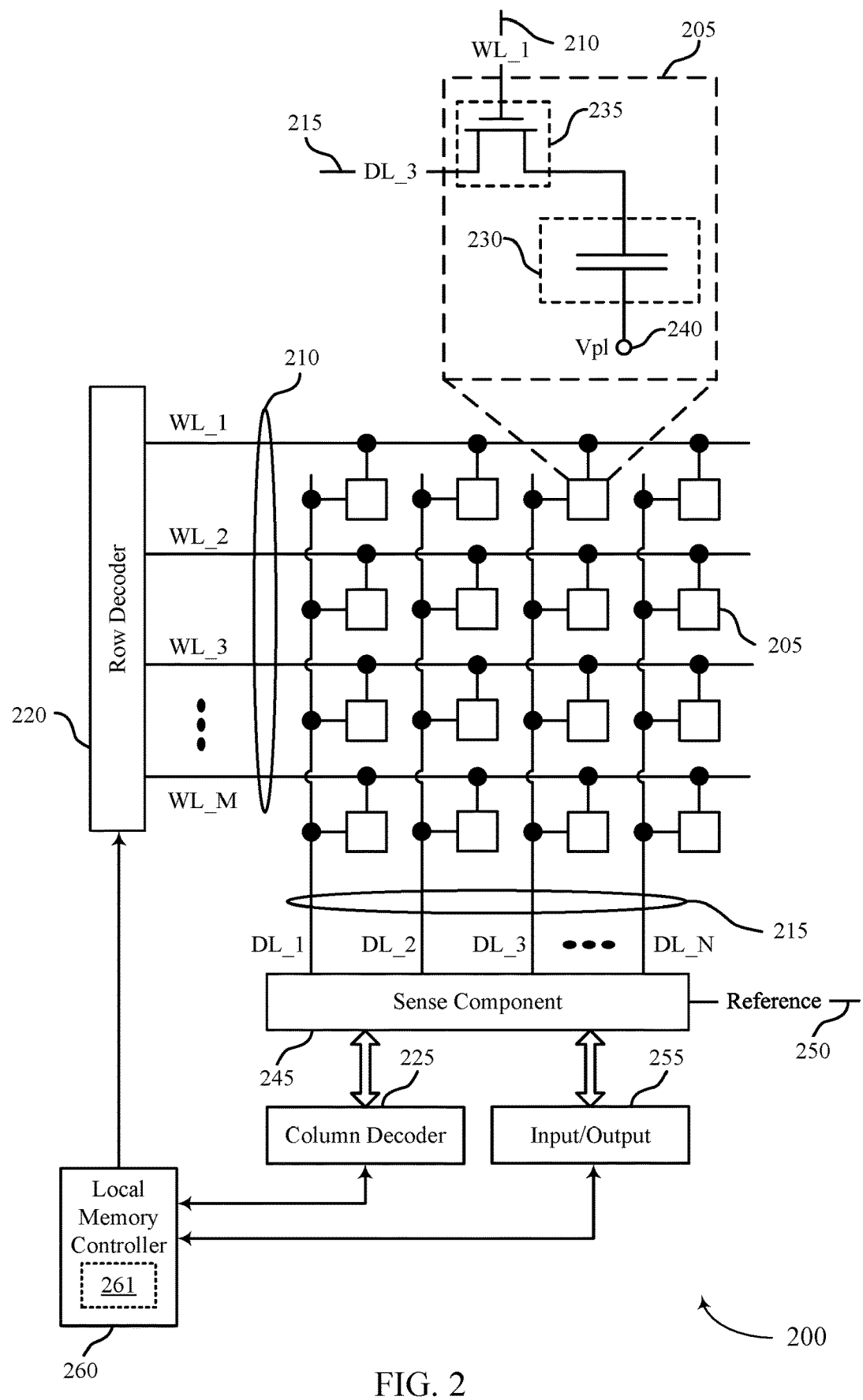
FIG. 2 illustrates an example of a memory die that supports operational monitoring for memory devices in accordance with examples as disclosed herein.

FIG. 2 illustrates an example of a memory die 200 that supports operational monitoring for memory devices in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state, which may be an example of a volatile storage component that may be used in the memory cells 205. In other memory architectures, other volatile or non-volatile storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading, and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different components, such as memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200, which may be an example of operating the memory die 200 in response to a command from a host device 105. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200, which may be another example of operating the memory die 200 in response to a command from a host device 105. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples, physical or operational aspects of the memory die 200 may degrade over time, and this degradation may be associated with a reduction of an ability to reliably store information (e.g., at a memory cell 205), a reduction of an ability to reliably read information (e.g., from a memory cell 205), a reduction of an ability to process information (e.g., at a local memory controller 260), or a reduction of an ability to communicate information (e.g., within the memory die 200, via digit lines 215, via input/output component 255, between the memory die 200 and a device memory controller 155), among other degradation. Degradation of the memory die 200 may be associated with a cumulative duration of the memory die 200 being powered (e.g., by a host device 105, by a device memory controller 155), a cumulative duration over which memory cells 205 are accessed or the local memory controller 260 is otherwise supporting access operations, a cumulative duration over which an operating parameter (e.g., a temperature, voltage, access rate, or other parameter of the memory die 200) satisfies a threshold, and other durations or conditions. For example, over time, one or more components of the memory die 200 may experience dielectric breakdown, ion or other constituent material migration or transformation, thermal stress or damage, mechanical stress or damage, fatigue, or other changes that affect operational reliability of the memory die 200.

In accordance with examples as disclosed herein, the memory die 200 (e.g., the local memory controller 260) may include various components (e.g., logic, circuitry) configured for monitoring health and life expectancy of the memory die 200. Such monitoring may include or involve components internal to the memory die 200 that identify and store various indications of a duration of operating the memory die 200, such as a monitoring circuit 261 which may be an example of a monitoring circuit 166 described with reference to FIG. 1.

In some examples, the monitoring circuit 261 may include one or more counters or other circuits or logic to determine various operational durations, which may refer to die-level durations of the memory die 200. In some examples, the monitoring circuit 261 may include sensors or monitors for detecting operating parameters (e.g., a temperature sensor, a voltage sensor, a humidity or moisture sensor, an access rate or row hammer sensor), or the monitoring circuit 261 may receive such information from another component (e.g., from within the memory die 200, from outside the memory die 200). Such information may be used to evaluate operating parameters at the memory die 200 and support accumulating durations over which an operating parameter satisfies a threshold. Additionally or alternatively, such information may support the memory die 200 tracking or identifying an immediate or instantaneous violation, such as an overvoltage condition, an excessive temperature condition, an excessive access rate or row hammer condition, or an excessive moisture or humidity condition. The monitoring circuit 261 may be configured to store an indication of an instance of such a violation by setting a flag (e.g., indicating a presence of such a violation), or incrementing a counter of operating condition violations (e.g., tracking a quantity of such violations), among other techniques, which may or may not be associated with or otherwise correspond to a stored duration of such a violation.

The memory die 200 may include a non-volatile storage component for storing indications of operating durations of the memory die 200, which may include or refer to one or more of the memory cells 205, one or more memory cells different than the memory cells 205 (e.g., memory cells of the monitoring circuit 261, which may have a different degree of volatility than the memory cells 205), or some other storage component of the memory die 200 (e.g., of the monitoring circuit 261). In various examples, such a non-volatile storage component may be physically coupled with or otherwise attached to a same substrate as the memory cells 205. For example, one or more components of the memory die 200, including the non-volatile storage component for storing indications of operating durations of the memory die 200, may be physically coupled with or otherwise attached to a same substrate (e.g., a same chip or other semiconductor substrate).

In some examples, the memory die 200 (e.g., the local memory controller 260) may perform internal operations, such as calculations or comparisons of a stored duration to duration thresholds, to evaluate health or life expectancy of the memory die 200, and the memory die may provide related indications to a device memory controller 155 of a memory device 110 that includes the memory die 200, or a host device 105 (e.g., via a device memory controller 155, via channels 115). In some examples, the memory die 200 may provide operating durations to a device memory controller 155 or a host device 105 (e.g., based on proactive signaling, based on responding to polling or other requests), and the device memory controller 155 or the host device 105 may perform calculations or comparisons external to the memory die 200 to evaluate health or life expectancy of the memory die 200 (e.g., based on one or more operating durations determined or stored at the memory die 200 and signaled to the device memory controller 155 or host device 105). By supporting these and other evaluations related to operational durations of the memory die 200, a memory device 110 or host device 105 may support various proactive measures to maintain operational reliability, including indicating that the memory die 200, or the memory device 110 that includes the memory die 200, should be replaced, modifying operation (e.g., timing parameters, voltage parameters, access rates) of an aging memory die 200, or selecting a different memory die 200 of the same or different memory device 110 for various data storage or access operations.

Figure 3:
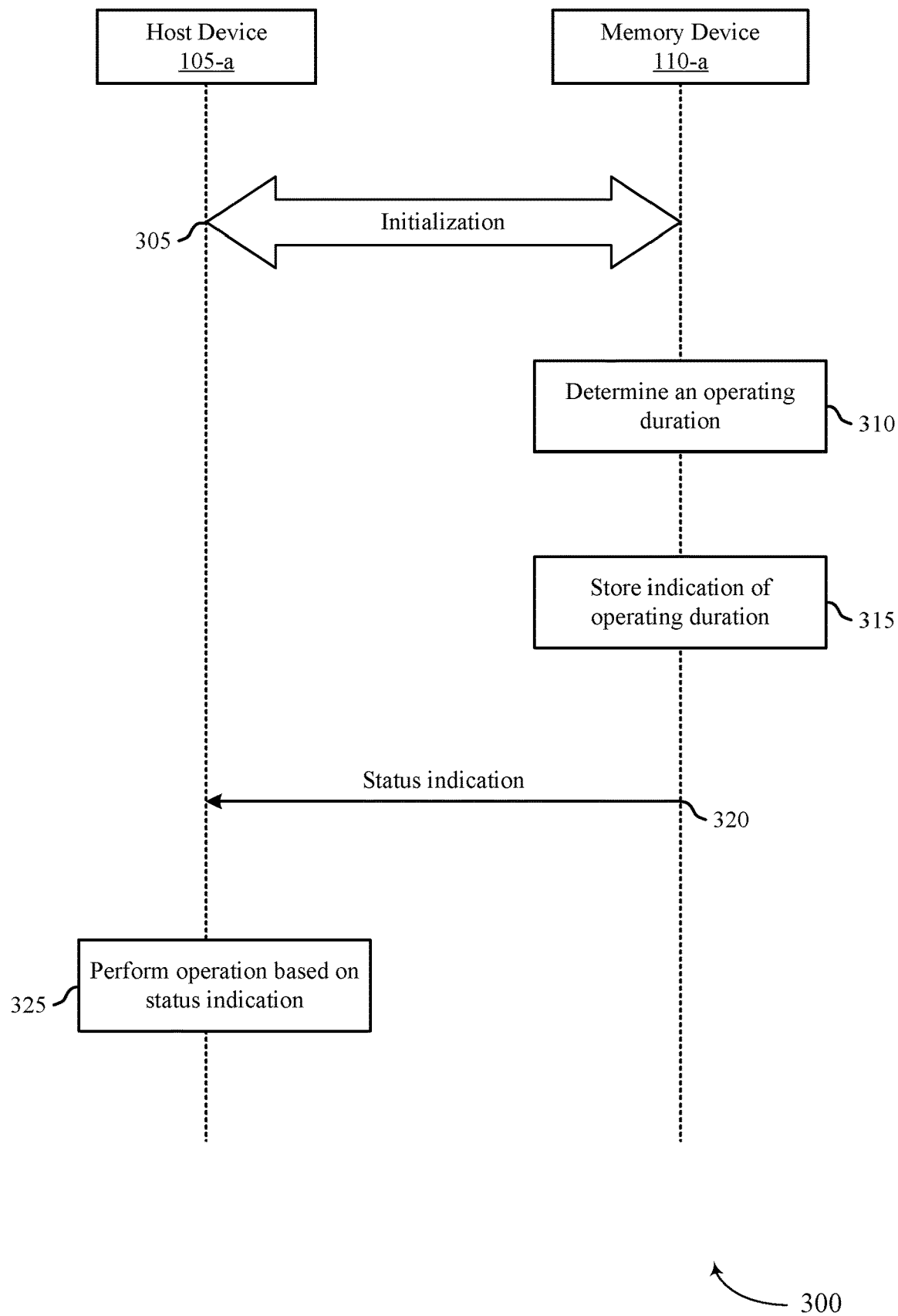
FIG. 3 illustrates an example of a system and associated operations and signaling that support operational monitoring for memory devices in accordance with examples as disclosed herein.

FIG. 3 illustrates an example of a system 300 and associated operations and signaling that support operational monitoring for memory devices in accordance with examples as disclosed herein. The system 300 includes a host device 105-a and a memory device 110-a, which may be examples of the respective components described with reference to FIG. 1. The host device 105-a and the memory device 110-a may be coupled via a physical or logical interface, such as channels 115, that support signaling between the respective devices. The memory device 110-*a* may illustrate an example of an apparatus that includes an array of memory cells 205 couplable to an interface with a processor or SoC (e.g., of the host device 105-*a*) and configured to operate in response to commands from the processor or the SoC. The memory device 110-*a* may include logic or circuitry (e.g., a monitoring circuit 156, one or more monitoring circuits 166, one or more monitoring circuits 261, or various combinations thereof) that may be attached to a same substrate, for example, as the array of memory cells 205, which may be configured to support various operations described herein. In some examples, the array of memory cells 205 of the memory device 110-*a* may be volatile memory cells, and the memory device 110-*a* may further include a non-volatile storage component (e.g., one or more non-volatile memory cells, latches, fuses or anti-fuses) configured to store an indication of a duration of operating the array of memory cells 205.

At 305, the host device 105-*a* and the memory device 110-*a* may perform an initialization operation, which may include initializing operation of the memory device 110-*a*. In some examples, the initialization of 305 may include or refer to powering the memory device 110-*a* (e.g., a power cycle), which may include coupling or activating a power supply from the host device 105-*a* to the memory device 110-*a* (e.g., enabling or coupling a supply voltage with the memory device 110-*a*, where a supply voltage may be referred to as VDD). In some examples, the initialization of 305 may include or refer to the memory device 110-*a* exiting an idle mode, which may be a response to an explicit command by the host device 105-*a* for the memory device 110-*a* to exit the idle mode, or may be a determination by the memory device 110-*a* to exit the idle mode responsive to a condition or signaling from the host device 105-*a* (e.g., in response to a change in power supply or voltage supply, in response to an access command from the host device 105-*a*). In a vehicle application, for example, the initialization of 305 may refer to a key-on or other turn-on condition, though the initialization of 305 may more-generally refer to a "use" of the memory device 110-*a*.

At 310, the memory device 110-*a* may determine one or more operating durations of or conditions associated with the memory device 110-*a*, which may be based at least in part on the initialization of 305. For example, the memory device 110-*a* may count or accumulate a duration of operating the memory device 110-*a* after the initializing of 305, which may include a total duration since the initializing of 305, a duration for which an operating condition of the memory device 110-*a* satisfies a threshold (e.g., an event-wise duration), or a duration that is scaled according to various operating conditions of the memory device 110-*a*. For example, the memory device 110-*a* may determine a duration that power is provided to the memory device 110-*a* (e.g., a duration that the memory device 110-*a* is provided with a supply voltage, a duration that the memory device 110-*a* is under a voltage bias or stress), or a duration associated with accessing a memory array 170 of the memory device 110-*a* (e.g., a duration that the memory device 110-*a* is actively performing access operations or is otherwise operable to respond to access commands from the host device 105-*a*).

In some examples, at 310, the memory device 110-*a* may determine a total duration of operating the memory device 110-*a*, since a first initializing operation of the memory device 110-*a*, associated with a plurality of initializing operations (e.g., a lifetime duration over a set of initializations). For example, the memory device 110-*a* may determine a duration since the initializing of 305, and add the determined duration to an accumulated duration corresponding to one or more previous initializations (not shown) since the memory device 110-*a* was manufactured, or installed in a product or assembly, or physically coupled with (e.g., directly or indirectly to) the host device 105-*a*. In some examples, the memory device 110-*a* may determine a total duration of operating a memory array 170 or memory die 160 of the memory device 110-*a*, since a first initializing operation of the apparatus, associated with a plurality of initializing operations.

In some examples, at 310, the memory device 110-*a* may determine one or more durations for which an operating parameter of the memory device 110-*a* satisfies a threshold (e.g., an event or instance associated with the operating parameter satisfying the threshold), which may or may not accompany a separate determination of an overall duration of the memory device 110-*a* (e.g., an overall or cumulative duration that the memory device 110-*a* is powered, an overall or cumulative duration that the memory device 110-*a* is performing access operations or is otherwise configured to respond to access commands from the host device 105-*a*). For example, the memory device 110-*a* may determine a duration over which a temperature, a voltage, an access rate, a humidity or moisture, or some other condition of the memory device 110-*a* satisfies (e.g., meets, exceeds, falls below) an associated threshold. In some examples, different durations may be determined for various bands or ranges of an operating condition, such as a first duration over which an operating temperature falls below a threshold and a second duration over which an operating temperature exceeds a threshold.

In some examples, a duration over which an operating condition satisfies a threshold may be scaled, such as scaling a duration over which an operating temperature, voltage, access rate, or moisture meets or exceeds a threshold. For example, when accumulating a total duration since the initialization of 305, the memory device may apply a scaling factor or multiplier to a duration, a clock signal, a clock divider, or a duration counter while the operating temperature, voltage, access rate, or moisture meets or exceeds the threshold, effectively accelerating the accumulation of the operating duration (e.g., an "effective" operating duration) of the memory device 110-*a*. Such techniques may account for detected operating conditions that may be associated with accelerating degradation of the memory device 110-*a*.

In some examples, a duration determined by the memory device 110-*a* at 310 may be associated with a detection of exploit conditions or other adverse operation or command of the memory device 110-*a*. For example, the memory device 110-*a* may determine one or more conditions indicative of an exploit of the memory device 110-*a*, and, at 310, may determine a duration associated with the exploit of the memory device 110-*a*. In various examples, determining a duration of an exploit or other adverse access of the memory device 110-*a* may or may not accompany a separate determination of an overall duration of the memory device 110-*a*, or a duration over which an operating condition satisfies a threshold. For example, exploit monitoring may be auxiliary to other duration monitoring.

At 315, the memory device 110-*a* may store an indication of the operating duration determined at 310. In some examples, the indication may be stored in a non-volatile storage component of the memory device 110-*a* (e.g., external to the host device 105-*a*), which may be attached to a same substrate as a memory array 170 or memory die 160 of the memory device, and coupled to the logic or circuitry configured to perform the operations of the memory device 110-*a* described herein. In various examples, the non-volatile storage component for storing the indication at 315 may be separate from an array of volatile memory cells 205 or may be a portion of a memory array 170 that normally operates in a volatile mode (e.g., operating a normally volatile memory cell 205 in a manner that leverages some degree of non-volatility). In some examples, the memory device 110-*a* may include a memory array 170 of non-volatile memory cells 205, and the storing of the indication of the operating duration at 315 may use a portion of such a memory array 170. In some examples, the storage component for storing the operating duration may refer to a mode register of the memory device 110-*a*.

In some examples, the memory device 110-*a* may additionally or alternatively store an indication of a quantity of initializing operations of the memory device 110-*a*, including the initialization of 305. For example, the initialization of 305 may be associated with conditions that cause a cyclic fatigue of the memory device 110-*a*, and an accumulated count of how many initializations have been performed may be indicative of certain aspects of health or degradation of the memory device 110-*a*. In some examples, the memory device 110-*a* may store an exploit or other indicator associated with an indication of a duration of operating the memory device (e.g., based at least in part on determining conditions indicative of an exploit or other adverse accessing or command of the memory device 110-*a*). In some examples, the memory device 110-*a* may have access to a date or other relevant timestamp (e.g., by way of active signaling of the host device 105-*a*, by way of polling by the memory device 110-*a*), and the memory device 110-*a* may store a timestamp associated with the indication of the duration of operating the memory device, or a timestamp associated with an exploit or other adverse accessing or command, or a timestamp associated with operating under various conditions (e.g., extreme conditions), among other timestamp indications.

In some examples, the memory device 110-*a* may additionally or alternatively be configured for tracking or identifying an immediate or instantaneous violation of an operating condition, such as an overvoltage condition, an excessive temperature condition, an excessive access rate or row hammer condition, or an excessive moisture or humidity condition. In some examples, the memory device 110-*a* may store (e.g., in a non-volatile storage component) an indication of an instance of such a violation by setting a flag (e.g., indicating a presence of such a violation), or incrementing a counter of operating condition violations (e.g., tracking a quantity of such violations), among other techniques, which may or may not be associated with or otherwise correspond to a stored duration of such a violation.

At 320, the memory device 110-*a* may transmit a status indication to the host device 105-*a*, which may be based at least in part on the indication of the operating duration stored at 315. In various examples, the status indication of 320 may be transmitted proactively by the memory device 110-*a*, such as a periodic transmission (e.g., according to a signaling interval) or a transmission that is triggered by another condition at the memory device 110-*a* (e.g., a transition to an operating mode, an operating condition satisfying a threshold, an operating duration satisfying a threshold, the initialization of 305, a powering down or entering of an idle mode). In some examples, the status indication of 320 may be associated with (e.g., responsive to) a polling or a request by the host device 105-*a*, such as a polling of or a reading from a mode register of the memory device 110-*a*.

In some examples, the status indication of 320 may be an implicit or explicit indication of a duration that the memory device 110-*a* has been operated (e.g., an absolute time, an effective time that may or may not include a duration scaled in response to an operating condition), or an indication that a duration exceeds or falls within a range of a set of ranges. In some examples, the status indication of 320 may be an indication that a duration satisfies (e.g., meets or exceeds) a duration threshold, which may refer to a duration threshold assigned at the memory device 110-*a* (e.g., during manufacturing or initial configuration, a configured life expectancy), or a duration threshold commanded to the memory device 110-*a* (e.g., in a configuration commanded by the host device 105-*a*, a threshold stored in a mode register of the memory device 110-*a*). For example, based at least in part on a stored indication of an operating duration, the memory device 110-*a* may determine that inferred or detected degradation may satisfy a threshold, or determine an estimate of remaining life expectancy, and the status indication of 320 may include an indication that the memory device 110-*a* should be replaced, should be operated at a reduced rate or capacity, should be operated in a different mode, or other indication associated with the stored duration of operating the memory device 110-*a*. In other examples (e.g., when the status indication of 320 includes an implicit or explicit indication of the operating duration), the host device 105-*a* may perform such calculations, comparisons, or determinations about the status or health of the memory device 110-*a*.

At 325, the host device 105-*a* may perform an operation based at least in part on the status indication of 320 (e.g., based at least in part on receiving a status of the memory device 110-*a*, based at least in part on receiving the indication of the duration that the memory device 110-*a* has been operated). In some examples, at 325, the host device 105-*a* may transmit or signal an indication of a status of the memory device 110-*a* to another device, or to a user of the host device. For example, the host device 105-*a* may provide or initiate an indication to a user that the memory device 110-*a* may be degraded or should be replaced (e.g., as a repair or maintenance indicator).

In some examples, the host device 105-*a* may provide information, such as an indication of an operating duration, or an indication that an operating duration exceeds a threshold (e.g., a threshold related to life expectancy of the memory device 110-*a*) to a servicing entity or a manufacturer (e.g., an original equipment manufacturer (OEM) of the memory device 110-*a*, or the host device 105-*a*, or a system that includes the memory device 110-*a* and the host device 105-*a*). Such indications may include periodic indications, triggered indications (e.g., upon an operating duration satisfying a threshold), polled or requested indications, or various combinations thereof. In some examples, such indications may be coded or encrypted by the host device 105-*a*. Such information may support a servicing entity or manufacturer analyzing statistical distributions of usage or operational characteristics of memory devices 110 or analyzing wear-out or degradation mechanisms and related life expectancy metrics, among other benefits.

In some examples, at 325, the host device 105-*a* may change a parameter for operating the memory device 110-*a*, which may include changing a parameter at the host device 105-*a* that is used in the access or operation of the memory device 110-*a*, or commanding or requesting (e.g., using a command signal to the memory device 110-*a*) a change to a parameter at the memory device 110-*a* that is used in the access or operation of the memory device 110-*a*, or a combination thereof. In various examples, changing a parameter for accessing or operating the memory device 110-*a* may include changing (e.g., reducing) a rate of accessing the memory device 110-*a*, modifying a voltage supplied to the memory device 110-*a*, changing a priority, reliability, or information class associated with the memory device 110-*a* (e.g., refraining from using the memory device 110-*a* for critical information or safety systems, using the memory device 110-*a* for non-critical information such as media systems), or refraining from using the memory device 110-*a*, or portion thereof, altogether (e.g., determining to use a different memory device 110, determining to use a different portion of the memory device 110-*a*).

Although the techniques illustrated by the system 300 refer to operations of and signaling between a host device 105-*a* and a memory device 110-*a*, in some examples, the described operations and signaling may be performed between a host device 105 and one or more memory dies 200. For example, each memory die 200 of a set of one or more memory dies of a memory device 110 may determine a respective operating duration, and store an indication of the operating duration respective to each memory die 200 (e.g., using a non-volatile storage component of each memory die 200, using a combined non-volatile storage component of the memory device 110, such as a non-volatile storage component of a device memory controller 155). In some examples, a device-level status indication may be communicated to the host device 105, which may indicate a minimum, average, maximum, or otherwise processed aggregation of the respective operating durations of the memory dies 200 of the memory device 110. In some examples, a respective die-level indication for each memory die 200 may be communicated to the host device 105, which may support the host device 105 indicating a quantity or specific memory dies 200 having potential degradation above a threshold (e.g., to a user, in a maintenance indication), selecting respective memory dies 200 for certain access operations (e.g., prioritizing operations on certain memory dies 200 according to indicated operating durations), or modifying operating parameters for respective memory dies 200, among other responsive operation, based on the die-level indications of operating durations.

Although the example of system 300 illustrates an example where the host device 105-*a* performs operations based on the status indication of 320, in some examples, the described techniques for operational monitoring at a memory device 110 or memory die 200 may not include the status indication of 320 or may support further monitoring functionality in addition to the status indication of 320. For example, stored indications of operating durations may be polled or requested in diagnostic or maintenance operations that are different from the operations of a host device 105 to support, for example, field data analysis, routine or preventative maintenance performed on the system 300. In a vehicle application, for example, indications of an operating duration stored at a memory device 110, or related indications (e.g., status indications of 320) passed to an integrated controller by a memory device 110, may be polled by a diagnostic tool via an on-board diagnostics (OBD) connector or other diagnostic interface of the vehicle, to evaluate whether a memory device 110, or a combination of a host device 105 and a memory device (e.g., an integrated vehicle controller including a processor and memory array), should be replaced.

Figure 4:
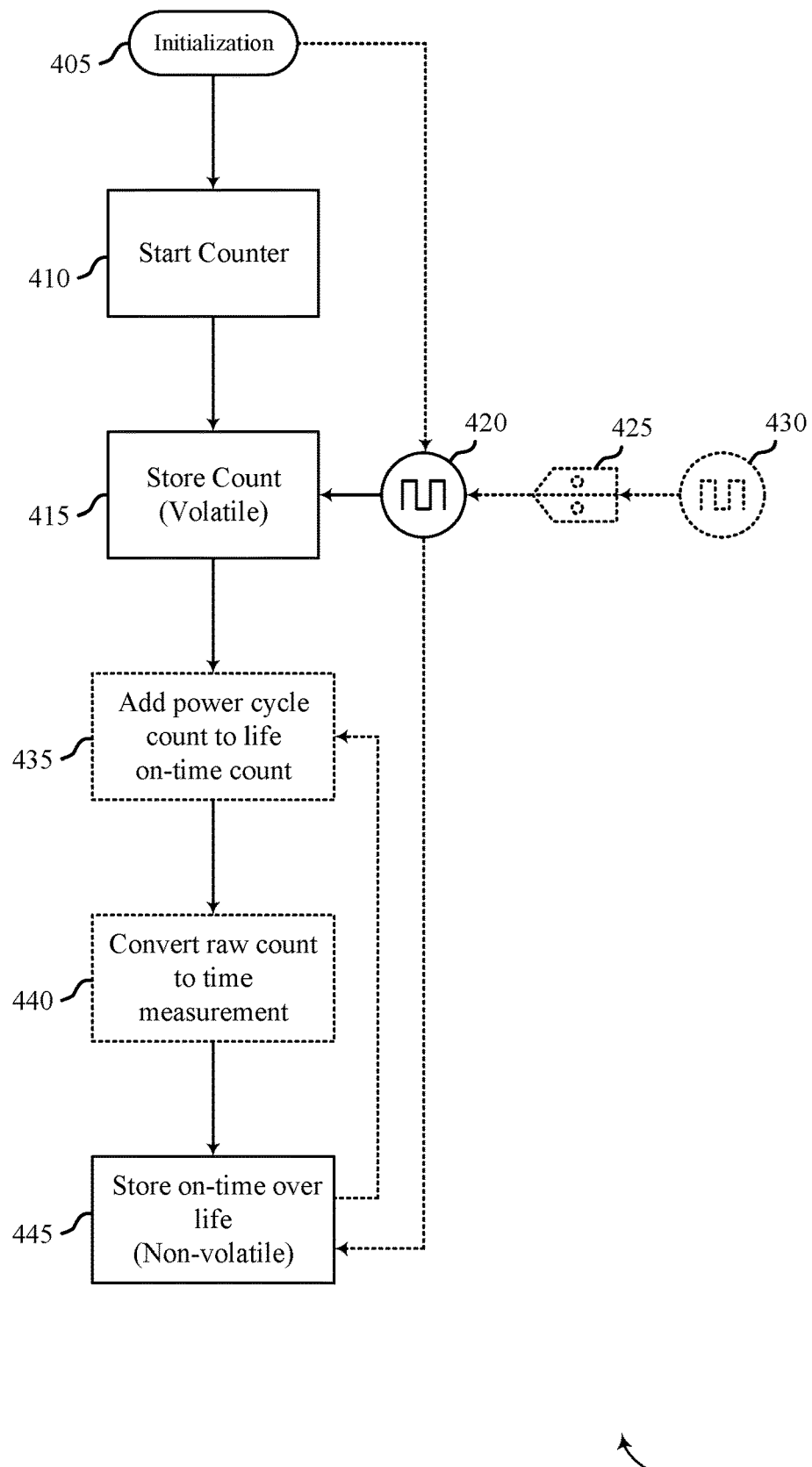
FIG. 4 illustrates an example of a diagram that supports operational monitoring for memory devices in accordance with examples as disclosed herein.

FIG. 4 illustrates an example of a monitoring architecture 400 that supports operational monitoring for memory devices in accordance with examples as disclosed herein. In various examples, the monitoring architecture 400 may illustrate operations and components (e.g., logic or circuitry components to perform or support the described operations) of a memory device 110, or one or more memory dies 160 of a memory device 110.

At 405, the memory device 110 or memory die 160 may perform an initialization. The operations of 405 may be an example of the operations of 305 described with reference to the system 300. For example, the initialization of 405 may include or refer to a power-on event, a power cycle, a key-on event in a vehicle application, an exit from an idle mode, or other aspects of an initialization of the memory device 110 or memory die 160. In some examples, the initialization of 405 may include or be accompanied by initializing or powering a signal source, such as a clock signal source 420.

At 410, the memory device 110 or memory die 160 may start a counter. For example, when tracking an operational duration based on a clock or other oscillating signal, the operations of 410 may include initializing or zeroing a counter that counts transitions of the oscillating signal or coupling a counter with an oscillating signal source (e.g., clock signal source 420). In some examples, the operations of 410 may include or be accompanied by incrementing a power cycle count, which may be stored in a non-volatile storage component of the memory device 110 or memory die 160 (e.g., to accumulate a count of power cycles over the lifetime of the memory device 110 or memory die 160).

At 415, the memory device 110 or memory die 160 may store a count (e.g., a counter value). For example, based at least in part on starting the counter at 410, a counter may accumulate a count of signal transitions (e.g., high-to-low transitions, low-to-high transitions) of an oscillating signal. The stored count of 415 may refer to a raw count or running count since the initialization of 405 (e.g., a count since power-on, a quantity of counts of other indication of a length of time during a power cycle). In some examples, the stored count of 415 may refer to a count that is stored or accumulated in a volatile storage component of the memory device 110 or memory dies 160, such as one or more volatile memory cells or volatile latches. In some examples, the stored count of 415 may be provided for other monitoring functions, which may be internal to the memory device 110 or memory die 160.

The stored count of 415 may be based at least in part on an oscillating signal received from a clock signal source 420. The clock signal source 420 may refer to an oscillator of the memory device 110 or the memory die 160, or may refer to a component that converts, receives, or otherwise processes an oscillating signal from another component or device. In some examples, the clock signal source 420 may refer to a self-refresh oscillator of the memory device 110 or the memory die 160.

In some examples, an oscillator of the memory device 110 or memory die 160 may have a frequency of oscillation that is different than (e.g., higher than) necessary or desired for the health monitoring operations described herein. For example, health monitoring may not require a resolution or a granularity according to a self-refresh oscillator of the memory device 110 or memory die 160 and counting at such a rate may involve more storage elements (e.g., volatile memory cells or latches) than desirable. Thus, the memory device 110 or memory die 160 may include a clock divider 425 that provides, to the clock signal source 420, an oscillating signal having a frequency that is some fraction of the frequency of a clock signal source 430. The clock signal source 430, the clock divider 425, and the clock signal source 420 may illustrate an example for receiving a first clock signal from an oscillator of the memory device, the first clock signal having a first frequency, and generating a second clock signal based at least in part on the first clock signal, the second clock signal having a second frequency that is lower than the first frequency. Accordingly, the operations of 415 may include counting a quantity of cycles of the second clock signal, which may support determining a duration of operating the memory device 110 or memory die 160 based at least in part on the quantity of cycles of the second clock signal.

In some examples, the clock signal source 430 may include or refer to a self-refresh oscillator of the memory device 110 or memory die 160, and the clock divider 425 may provide a signal having a frequency that is a fraction of the self-refresh oscillator (e.g., according to a 10:1 ratio, according to a 100:1 ratio, or any other ratio). The clock divider 425 may be specific to or dedicated to the determination of operating durations or other aspects of health monitoring as described herein, and the clock signal source 430 may be used for other operations without the scaling performed by the clock divider 425.

In some examples, the clock divider 425, or another processing or conversion component, may support the scaling of a clock rate or signal frequency based at least in part on an operating condition of the memory device 110 or memory die 160. For example, such a clock divider or conversion component may have a first frequency ratio at a first voltage, temperature, moisture level, or access rate, and a second, different frequency ratio at a second voltage, temperature, moisture level, or access rate. In some examples, a clock signal source 420, or a clock signal source 430, or a combination thereof may support a clock rate itself that is based at least in part on an operating condition, such as a clock rate that is proportional or inversely proportional to voltage, temperature, moisture level, or access rate, or some combination thereof. For example, a clock signal source 420 or a clock signal source 430 may be configured to operate with a lower frequency at relatively lower operating voltages and a higher frequency at relatively higher operating voltages, or with a relatively higher frequency under row hammer conditions, among other techniques. Such techniques may enable the memory device 110 or memory die 160 to accelerate or decelerate an of counts at 415 (e.g., scaling counts of the clock signal source 430), which may support an "effective" count or duration accumulation to account for operating conditions that may accelerate or decelerate aging or degradation of the memory device 110 or memory die 160. In some examples, indications related to acceleration of clock signal sources, clock signal dividers, or health monitoring counters (e.g., associated with accelerated degradation of a memory device 110) may be provided to a host device 105, which may support the host device 105 selectively operating a memory device 110 in a manner that considers degradation rate of the memory device (e.g., adjusting operating parameters based at least in part on receiving an indication of accelerated or decelerated degradation.

In some examples, at 435, the memory device 110 or memory die 160 may add a power cycle count (e.g., a stored count of 415) to a life on-time count. For example, an on-time count over the lifetime of the memory device 110 or memory die 116, which may refer to a count or duration stored in a non-volatile storage component of the memory device 110 or memory die 160 (e.g., prior to the initialization of 405), may be added to the count being accumulated since the initialization of 405. In some examples, such a count may refer to an instantaneous on-time count or duration of the memory device 110 or memory die 160 that is being actively updated (e.g., according to a clock signal source 420, in comparison to a count or duration stored in a non-volatile storage component, which may or may not be actively updated). In some examples, an instantaneous on-time count or duration determined at 435 may be provided for other monitoring functions, which may be internal to the memory device 110 or memory die 160. In some examples, the operations of 435 may be omitted.

In some examples, at 440, the memory device 110 or memory die 160 may convert a raw count (e.g., a stored count of 415, a count of 435 that includes a power cycle count and a life on-time count) to a time measurement. For example, a quantity of counts may be converted to a time unit that includes a quantity of seconds, minutes, hours, days, or a combination thereof. The operations of 440 may be an example of converting a quantity of cycles or counts into a duration measured in a time unit, such that storing an indication of a duration of operating the memory device 110 or memory die 160 may include storing an indication having the time unit. In some examples, the operations of 440 may be omitted, such that a stored indication remains in units of counts (e.g., of transitions of the clock signal source 420).

At 445, the memory device 110 or memory die 160 may store an indication of an on-time (e.g., powered time, active time) over the life of the memory device 110 or memory die 160. The storage operations of 445 may be referred to as writing a raw life on-time count, writing a total time (e.g., number of hours, number of minutes) of operation of the memory device 110 or memory die 160, or other descriptions. Although described in the context of an overall on-time of the memory device 110 or memory die 160, similar techniques may be applied to storage of condition-specific durations (e.g., durations associated with an operating condition satisfying a threshold, event-wise durations), indications or durations associated with exploit or other adverse command or accessing, among other types of indication storage.

In various examples, the operations of 445 may be performed periodically (e.g., according to an update interval, according to a clock rate), or event-driven (e.g., initiated by a quantity of counts satisfying a threshold, initiated upon a change in operating mode of the memory device 110 or memory die 160, upon entering an idle mode, upon completion of a power cycle). For example, when a previously-determined on-time duration or count (e.g., a duration or count prior to the initialization of 405) has been included in an instantaneous or otherwise actively updated on-time count or duration, which may be supported by the operations of 435, such a value may be committed to non-volatile storage at 445. In some examples, a stored count (e.g., as determined or stored at 415, which may or may not include a conversion of 440) may be added to a previously-determined on-time duration or count as part of the operations of 445, which may be initiated in accordance with the operations of 445. In some examples, the storage operations of 445 may be ongoing, such as when a count of transitions of the clock signal source 420 are added directly to the value stored in non-volatile storage.

In some examples, a stored count itself (e.g., a count or duration since the initialization of 405, as determined or stored at 415, which may or may not include a conversion of 440) may be committed to an instance of non-volatile storage of the memory device 110 or memory die 160, supporting the memory device 110 or memory die 160 recording a log of counts or duration per power cycle. In some examples, such a log of counts or durations may be separately added together to determine an overall on-time duration for the memory device 110 or memory die 160. Additionally or alternatively, such an approach may support performing other evaluations that may rely on an understanding of a quantity of power cycles, or a distribution of on-time durations over a set of power cycles.

The storage at 445 may be performed using various examples of non-volatile storage at a memory device 110 or a memory die 160. For example, the non-volatile storage may refer to or include non-volatile memory cells of a memory array (e.g., of a memory array 170) or other memory cells or storage components associated with control circuitry or logic of a memory device 110 or a memory die 160 (e.g., of a device memory controller 155, of a local memory controller 165). In some examples, the non-volatile storage component may refer to or include a storage element of a material-based storage architecture (e.g., a chalcogenide memory cell), a transistor-based storage architecture (e.g., a NAND or flash memory cell), or a non-volatile latch. In some examples, the non-volatile storage component may refer to or include a one-time programmable storage element, such as a fuse or anti-fuse. In some examples, the storage of 445 may refer to writing a duration or quantity of counts to a register of the memory device 110 or memory die 160, such as a mode register, which may be polled by a host device 105.

Although some aspects of the storage at 445 are described in the context of information storage in memory cells or latches, the described techniques may leverage other types of non-volatile storage that support storing an indication of an on-time duration of a memory device 110 or memory die 160. For example, on-time durations may be tracked indirectly by way of aging or degrading components (e.g., switches, transistors, gates) according to a known or predicted degradation profile. For example, a clock signal source 420 may be coupled with a switching component, and the transitions of switching component in response to the signal from the clock signal source 420 may cause a degradation over time by way of negative-bias temperature instability (NBTI) or other degradation mechanism. Accordingly, a switching component that is intentionally aged degraded by way of a configured degradation mechanism while the memory device 110 or memory die 160 is powered on may support an inference of degradation of the memory device 110 or memory die 160, without storing an explicit indication of a quantity of counts or other duration. Such a switching component may be polled or probed periodically to evaluate a health or other condition of the associated memory device 110 or memory die 160.

Figure 5:
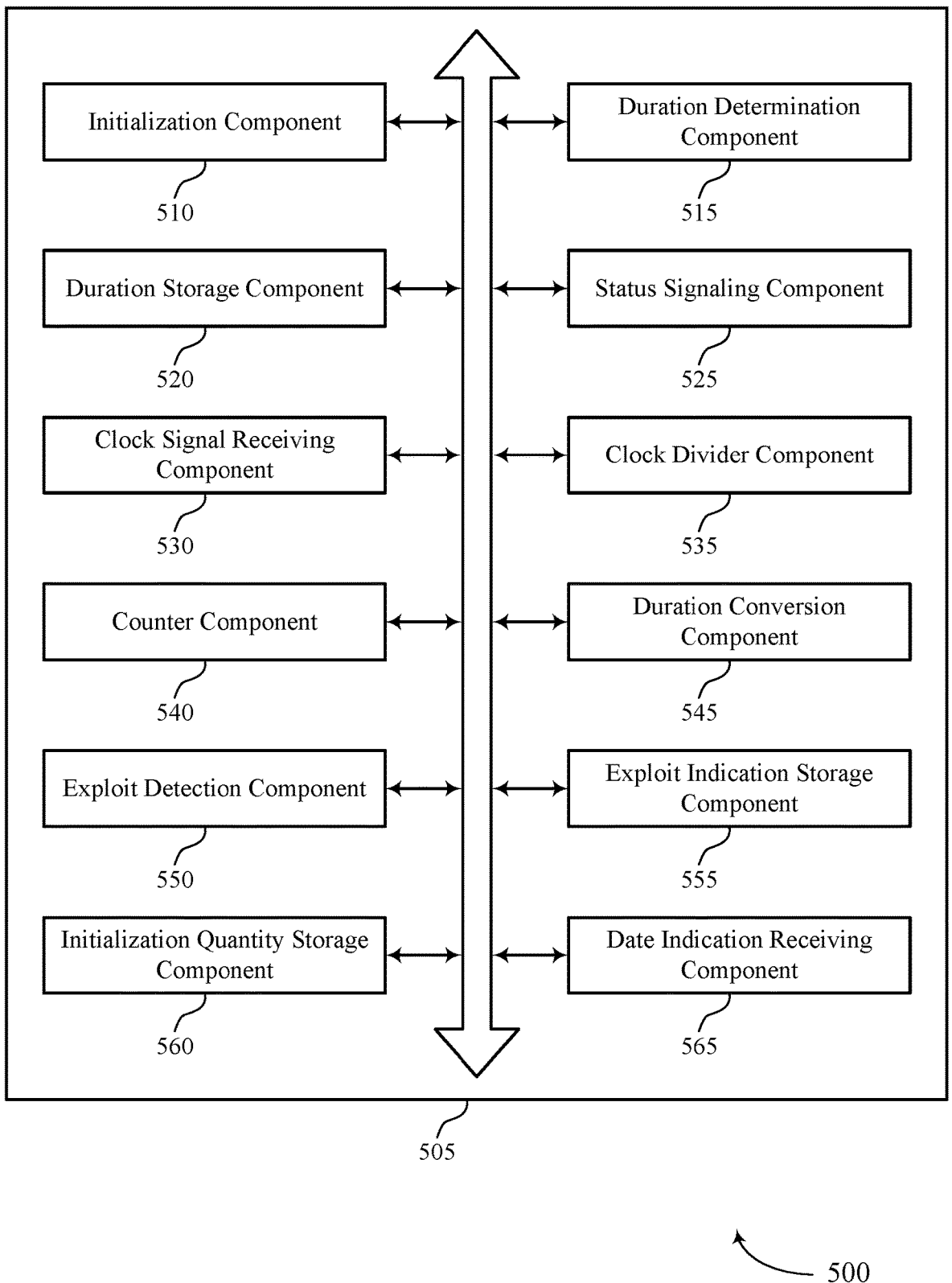
FIG. 5 shows a block diagram of a memory device that supports operational monitoring for memory devices in accordance with aspects of the present disclosure.

FIG. 5 shows a block diagram 500 of a memory device 505 that supports operational monitoring for memory devices in accordance with examples as disclosed herein. The memory device 505 may be an example of aspects of a memory device as described with reference to FIGS. 1 through 4. The memory device 505 may include an initialization component 510, a duration determination component 515, a duration storage component 520, a status signaling component 525, a clock signal receiving component 530, a clock divider component 535, a counter component 540, a duration conversion component 545, an exploit detection component 550, an exploit indication storage component 555, an initialization quantity storage component 560, and a date indication receiving component 565. Each of these modules may communicate, directly or indirectly, with one another (e.g., via one or more buses).

The initialization component 510 may initialize operation of the memory device 505. In some examples, to initialize operation of the memory device 505, the initialization component 510 may power on the memory device 505. In some examples, to initialize operation of the memory device 505, the initialization component 510 may exit an idle mode of the memory device 505.

The duration determination component 515 may determine, based on initializing operation of the memory device 505, a duration of operating the memory device 505. In some examples, to determine the duration of operating the memory device 505, the duration determination component 515 may determine a total duration of operating the memory device 505, since a first initializing operation of the memory device 505, associated with a set of initializing operations. In some examples, to determine the duration of operating the memory device 505, the duration determination component 515 may determine a duration that power is provided to the memory device 505. In some examples, to determine the duration of operating the memory device 505, the duration determination component 515 may determine a duration associated with accessing a memory array of the memory device 505. In some examples, to determine the duration of operating the memory device 505, the duration determination component 515 may determine a duration for which an operating parameter of the memory device 505 (an operating temperature of the memory device 505, an operating voltage of the memory device 505, or a rate of accessing the memory device 505) satisfies a threshold.

The duration storage component 520 may store (e.g., in a non-volatile storage component of the memory device 505) an indication of the duration of operating the memory device 505. In some examples, the duration storage component 520 may store, based on receiving an indication of a date or other timestamp of operating the memory device 505, a date or other temporal indication associated with the indication of the duration of operating the memory device 505.

The status signaling component 525 may signal, to a host device coupled with the memory device 505, a status of the memory device 505 based on storing the indication of the duration of operating the memory device 505. In some examples, the status signaling component 525 may determine that the duration of operating the memory device 505 satisfies a threshold and, to signal the status of the memory device 505, the status signaling component 525 may signal an indication that the duration of operating the memory device 505 satisfies the threshold. In some examples, to signal the status of the memory device 505, the status signaling component 525 may signal the indication of the duration of operating the memory device.

The clock signal receiving component 530 may receive a first clock signal from an oscillator of the memory device 505. The first clock signal may be associated with a first frequency.

The clock divider component 535 may generate a second clock signal based on the first clock signal. The second clock signal may be associated with a second frequency that is lower than the first frequency (e.g., of the first clock signal).

The counter component 540 may count a quantity of cycles of the second clock signal. In some examples, determining the duration of operating the memory device 505 may be based on the quantity of cycles of the second clock signal.

The duration conversion component 545 may convert the quantity of cycles into a duration measured in a time unit. In some examples, storing the indication of the duration of operating the memory device 505 may include storing the indication having the time unit.

The exploit detection component 550 may determine one or more conditions indicative of an exploit of the memory device 505.

The exploit indication storage component 555 may store, based on determining the one or more conditions indicative of the exploit, an exploit indicator associated with the indication of the duration of operating the memory device 505.

The initialization quantity storage component 560 may store (e.g., in a non-volatile storage component of the memory device 505), based on the initializing operation of the memory device 505, an indication of a quantity of initializing operations of the memory device.

The date indication receiving component 565 may receive, based on the initializing operation of the memory device, an indication of a date or other timestamp of operating the memory device 505.

Figure 6:
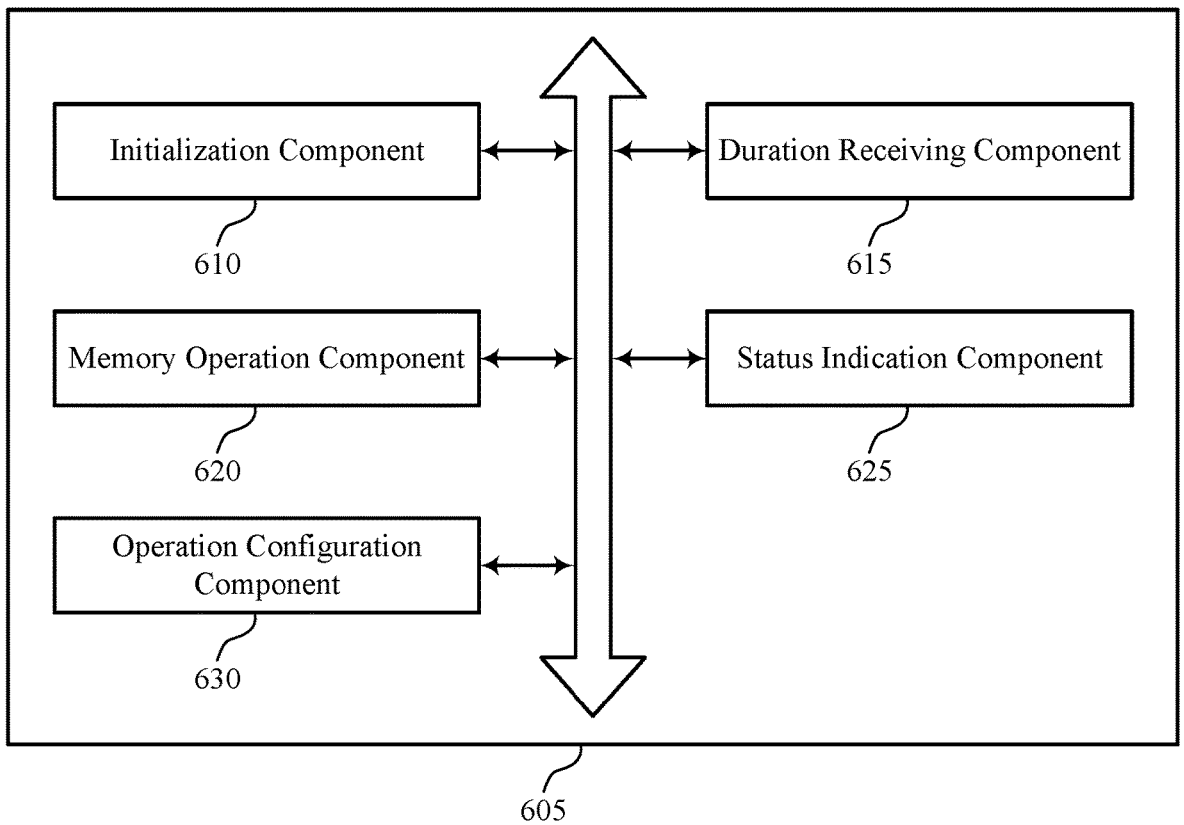
FIG. 6 shows a block diagram of a host device that supports operational monitoring for memory devices in accordance with aspects of the present disclosure.

FIG. 6 shows a block diagram 600 of a host device 605 that supports operational monitoring for memory devices in accordance with examples as disclosed herein. The host device 605 may be an example of aspects of a host device as described with reference to FIGS. 1 through 4. The host device 605 may include an initialization component 610, a duration receiving component 615, a memory operation component 620, a status indication component 625, and an operation configuration component 630. Each of these modules may communicate, directly or indirectly, with one another (e.g., via one or more buses).

The initialization component 610 may initialize operation of a memory device.

The duration receiving component 615 may receive, from the memory device and based on the initializing, an indication of a duration that the memory device has been operated. In some examples, to receive the indication of the duration that the memory device has been operated, the initialization component 610 may receive an indication that the duration that the memory device has been operated satisfies a threshold.

The memory operation component 620 may perform an operation based on receiving the indication of the duration that the memory device has been operated.

In some examples, to perform the operation based on receiving the indication of the duration that the memory device has been operated, the status indication component 625 may transmit an indication of a status of the memory device based on the indication of the duration that the memory device has been operated.

In some examples, to perform the operation based on receiving the indication of the duration that the memory device has been operated, the operation configuration component 630 may change a parameter for operating the memory device based on the indication of the duration that the memory device has been operated.

Figure 7:
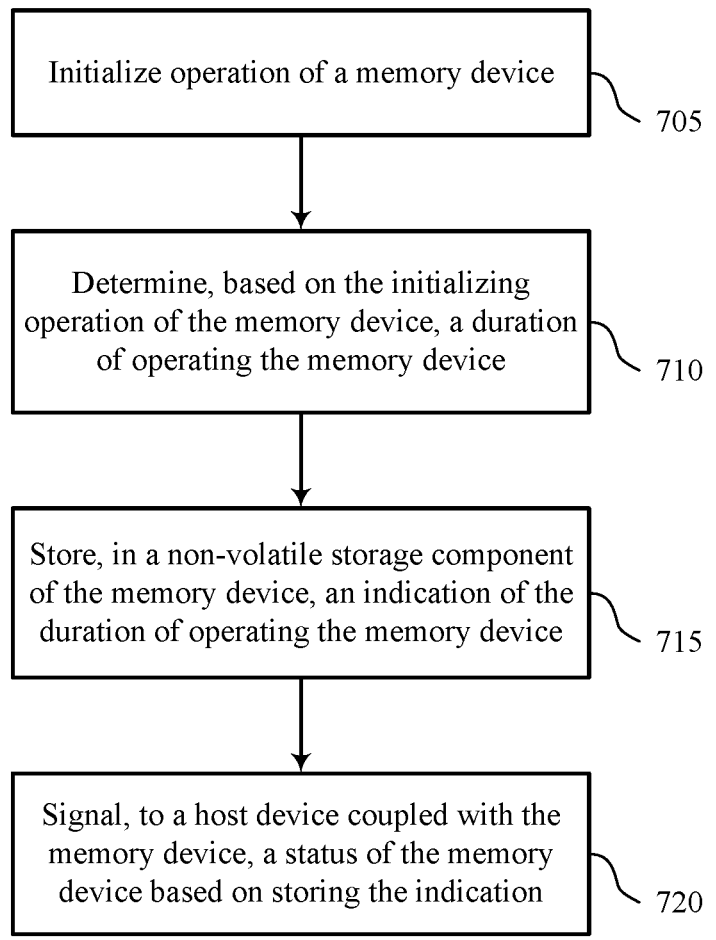
FIGS. 7 and 8 show flowcharts illustrating a method or methods that support operational monitoring for memory devices in accordance with examples as disclosed herein.

FIG. 7 shows a flowchart illustrating a method or methods 700 that supports operational monitoring for memory devices in accordance with aspects of the present disclosure. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware (e.g., logic, circuitry).

At 705, the memory device may initialize operation of the memory device. The operations of 705 may be performed according to the methods described with reference to FIGS. 3 and 4. In some examples, aspects of the operations of 705 may be performed by an initialization component as described with reference to FIG. 5.

At 710, the memory device may determine, based on the initializing operation of the memory device, a duration of operating the memory device. The operations of 710 may be performed according to the methods described with reference to FIGS. 3 and 4. In some examples, aspects of the operations of 710 may be performed by a duration determination component as described with reference to FIG. 5.

At 715, the memory device may store, in a non-volatile storage component of the memory device, an indication of the duration of operating the memory device. The operations of 715 may be performed according to the methods described with reference to FIGS. 3 and 4. In some examples, aspects of the operations of 715 may be performed by a duration storage component as described with reference to FIG. 5.

At 720, the memory device may signal, to a host device coupled with the memory device, a status of the memory device based on storing the indication. The operations of 720 may be performed according to the methods described with reference to FIGS. 3 and 4. In some examples, aspects of the operations of 720 may be performed by a status signaling component as described with reference to FIG. 5.

In some examples, an apparatus as described herein may perform a method or methods, such as the method 700. The apparatus may include features, logic, circuitry, means, or instructions (e.g., a non-transitory computer-readable medium storing instructions executable by a processor) for initializing operation of a memory device, determining, at the memory device and based on the initializing operation of the memory device, a duration of operating the memory device, storing, in a non-volatile storage component of the memory device, an indication of the duration of operating the memory device, and signaling, to a host device coupled with the memory device, a status of the memory device based on storing the indication.

Some examples of the method 700 and the apparatus described herein may further include operations, features, logic, circuitry, means, or instructions for determining that the duration of operating the memory device satisfies a threshold, and signaling the status of the memory device may include operations, features, logic, circuitry, means, or instructions for signaling an indication that the duration of operating the memory device satisfies the threshold.

In some examples of the method 700 and the apparatus described herein, signaling the status of the memory device may include operations, features, logic, circuitry, means, or instructions for signaling the indication of the duration of operating the memory device.

Some examples of the method 700 and the apparatus described herein may further include operations, features, logic, circuitry, means, or instructions for receiving a first clock signal from an oscillator of the memory device, the first clock signal having a first frequency, generating a second clock signal based on the first clock signal, the second clock signal having a second frequency that is lower than the first frequency, and counting a quantity of cycles of the second clock signal. In some examples, determining the duration of operating the memory device may be based on the quantity of cycles of the second clock signal.

Some examples of the method 700 and the apparatus described herein may further include operations, features, logic, circuitry, means, or instructions for converting the quantity of cycles into a duration measured in a time unit. In some examples, storing the indication of the duration of operating the memory device may include storing the indication having the time unit.

In some examples of the method 700 and the apparatus described herein, determining the duration of operating the memory device may include operations, features, logic, circuitry, means, or instructions for determining a total duration of operating the memory device, since a first initializing operation of the memory device, associated with a set of initializing operations.

In some examples of the method 700 and the apparatus described herein, determining the duration of operating the memory device may include operations, features, logic, circuitry, means, or instructions for determining a duration that power is provided to the memory device.

In some examples of the method 700 and the apparatus described herein, determining the duration of operating the memory device may include operations, features, logic, circuitry, means, or instructions for determining a duration associated with accessing a memory array of the memory device.

In some examples of the method 700 and the apparatus described herein, the initializing may include operations, features, logic, circuitry, means, or instructions for powering on the memory device.

In some examples of the method 700 and the apparatus described herein, the initializing may include operations, features, logic, circuitry, means, or instructions for exiting an idle mode of the memory device.

In some examples of the method 700 and the apparatus described herein, determining the duration of operating the memory device may include operations, features, logic, circuitry, means, or instructions for determining a duration for which an operating parameter of the memory device (e.g., an operating temperature of the memory device, an operating voltage of the memory device, or a rate of accessing the memory device) satisfies a threshold.

Some examples of the method 700 and the apparatus described herein may further include operations, features, logic, circuitry, means, or instructions for determining one or more conditions indicative of an exploit of the memory device, and storing, based on determining the one or more conditions indicative of the exploit, an exploit indicator associated with the indication of the duration of operating the memory device.

Some examples of the method 700 and the apparatus described herein may further include operations, features, logic, circuitry, means, or instructions for storing, in the non-volatile storage component of the memory device and based on the initializing operation of the memory device, an indication of a quantity of initializing operations of the memory device.

Some examples of the method 700 and the apparatus described herein may further include operations, features, logic, circuitry, means, or instructions for receiving, based on the initializing operation of the memory device, an indication of a date of operating the memory device, and storing, based on receiving the indication of the date of operating the memory device, a date associated with the indication of the duration of operating the memory device.

Figure 8:
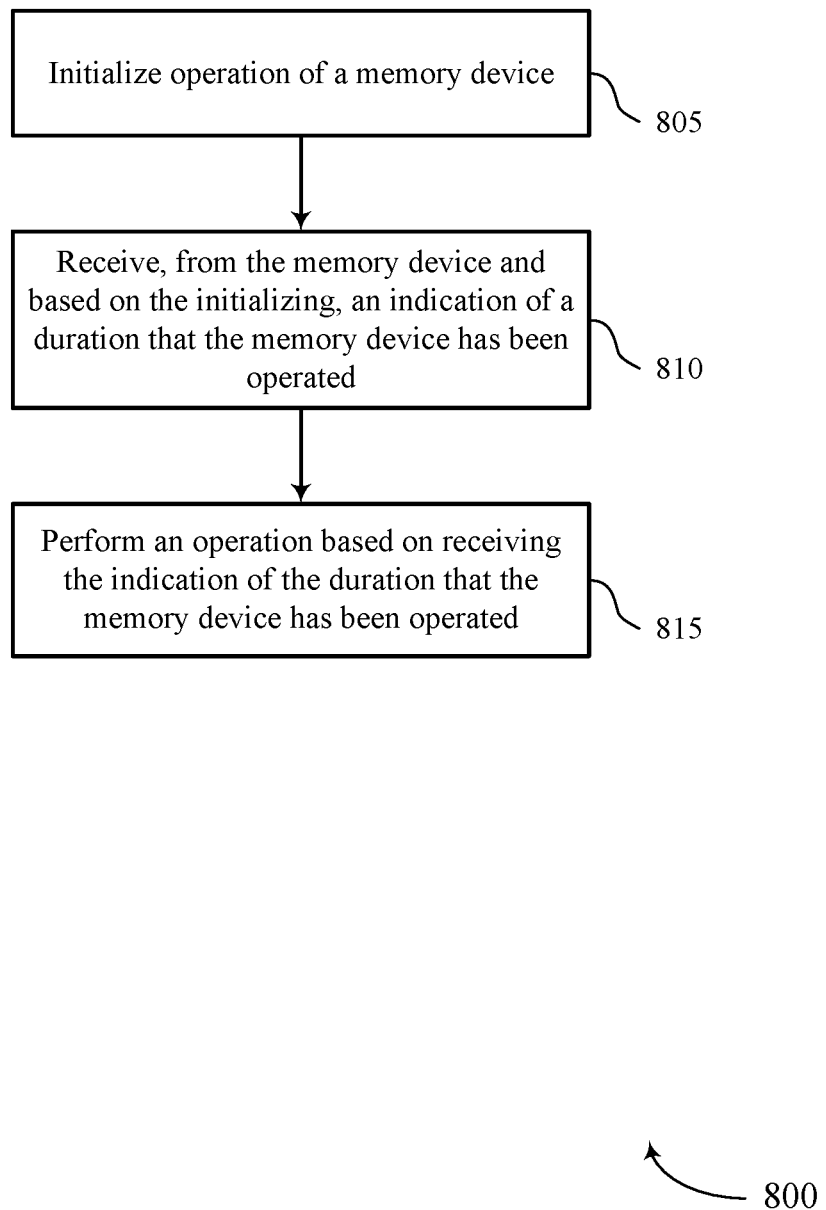

FIG. 8 shows a flowchart illustrating a method or methods 800 that supports operational monitoring for memory devices in accordance with aspects of the present disclosure.

The operations of method 800 may be implemented by a host device or its components as described herein. For example, the operations of method 800 may be performed by a host device as described with reference to FIG. 6. In some examples, a host device may execute a set of instructions to control the functional elements of the host device to perform the described functions. Additionally or alternatively, a host device may perform aspects of the described functions using special-purpose hardware.

At 805, the host device may initialize operation of a memory device. The operations of 805 may be performed according to the methods described with reference to FIGS. 3 and 4. In some examples, aspects of the operations of 805 may be performed by an initialization component as described with reference to FIG. 6.

At 810, the host device may receive, from the memory device and based on the initializing, an indication of a duration that the memory device has been operated. The operations of 810 may be performed according to the methods described with reference to FIGS. 3 and 4. In some examples, aspects of the operations of 810 may be performed by a duration receiving component as described with reference to FIG. 6.

At 815, the host device may perform an operation based on receiving the indication of the duration that the memory device has been operated. The operations of 815 may be performed according to the methods described with reference to FIGS. 3 and 4. In some examples, aspects of the operations of 815 may be performed by a memory operation component as described with reference to FIG. 6.

In some examples, an apparatus as described herein (e.g., a host device) may perform a method or methods, such as the method 800. The apparatus may include features, logic, circuitry, means, or instructions (e.g., a non-transitory computer-readable medium storing instructions executable by a processor) for initializing operation of a memory device, receiving, from the memory device and based on the initializing, an indication of a duration that the memory device has been operated, and performing an operation based on receiving the indication of the duration that the memory device has been operated.

In some examples of the method 800 and the apparatus described herein, receiving the indication of the duration that the memory device has been operated may include operations, features, logic, circuitry, means, or instructions for receiving an indication that the duration that the memory device has been operated satisfies a threshold.

In some examples of the method 800 and the apparatus described herein, performing the operation based on receiving the indication of the duration that the memory device has been operated may include operations, features, logic, circuitry, means, or instructions for transmitting an indication of a status of the memory device based on the indication of the duration that the memory device may have been operated.

In some examples of the method 800 and the apparatus described herein, performing the operation based on receiving the indication of the duration that the memory device has been operated may include operations, features, logic, circuitry, means, or instructions for changing a parameter for operating the memory device based on the indication of the duration that the memory device may have been operated.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells couplable to an interface with a processor or system-on-a-chip (SoC) and configured to operate in response to commands from the processor or the SoC, logic attached to a same substrate as the array of memory cells and configured to determine an indication of a duration of operating the array of memory cells, and a non-volatile storage component attached to a same substrate as the array of memory cells, coupled to the logic, and configured to store the indication of the duration of operating the array of memory cells.

In some examples of the apparatus, the logic may be configured to receive a first clock signal from an oscillator of the apparatus, the first clock signal having a first frequency, generate a second clock signal based on the first clock signal, the second clock signal having a second frequency that is lower than the first frequency, and count a quantity of cycles of the second clock signal. In some examples, determining the duration of operating the array of memory cells may be based on the quantity of cycles of the second clock signal.

In some examples of the apparatus, to determine the indication of the duration of operating the array of memory cells, the logic may be configured to determine a total duration of operating the array of memory cells, since a first initializing operation of the apparatus, associated with a set of initializing operations.

In some examples of the apparatus, to determine the indication of the duration of operating the array of memory cells, the logic may be configured to determine a duration that power is provided to the apparatus.

In some examples of the apparatus, to determine the indication of the duration of operating the array of memory cells, the logic may be configured to determine a duration associated with accessing the array of memory cells.

In some examples of the apparatus, to determine the indication of the duration of operating the array of memory cells, the logic may be configured to determine a duration for which an operating parameter of the apparatus satisfies a threshold.

In some examples of the apparatus, the logic may be configured to determine conditions indicative of an exploit of the apparatus, and the non-volatile storage component may be configured to store, based on the logic determining the conditions indicative of the exploit, an exploit indicator associated with the indication of the duration of operating the array of memory cells.

In some examples of the apparatus, the non-volatile storage component may be configured to store an indication of a quantity of initializing operations of the apparatus.

In some examples of the apparatus, the array of memory cells includes an array of volatile memory cells. In some examples of the apparatus, the non-volatile storage component may be separate from the array of volatile memory cells.

In some examples of the apparatus, the array of memory cells includes the non-volatile storage component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    initializing operation of a memory device;
    determining, by circuitry of the memory device and based at least in part on the initializing operation of the memory device, a cumulative duration, since the initializing operation of the memory device, for which an access rate of the memory device satisfies an access rate threshold;
    storing, in a non-volatile storage component of the memory device, an indication of the cumulative duration for which the access rate of the memory device satisfies the access rate threshold; and
    signaling, by the memory device to a host device coupled with the memory device and based at least in part on the cumulative duration satisfying a duration threshold, a status of the memory device, wherein the status of the memory device is based at least in part on the stored indication of the cumulative duration for which the access rate of the memory device satisfies the access rate threshold.

2. The method of claim 1, wherein signaling the status of the memory device comprises:
    indicating, to the host device coupled with the memory device, the cumulative duration for which the access rate of the memory device satisfies the access rate threshold.

3. The method of claim 1, further comprising:
    receiving, by the circuitry of the memory device, a first clock signal from an oscillator of the memory device, the first clock signal having a first frequency;

generating, by the circuitry of the memory device, a second clock signal based at least in part on the first clock signal, the second clock signal having a second frequency that is lower than the first frequency; and counting, by the circuitry of the memory device, a quantity of cycles of the second clock signal, wherein determining the cumulative duration for which the access rate of the memory device satisfies the access rate threshold is based at least in part on the quantity of cycles of the second clock signal.

4. The method of claim 3, further comprising:

converting, by the circuitry of the memory device, the quantity of cycles of the second clock signal into a duration measured in a time unit, wherein storing the indication of the cumulative duration for which the access rate of the memory device satisfies the access rate threshold comprises storing the cumulative duration by using units of the time unit.

5. The method of claim 1, wherein determining the cumulative duration for which the access rate of the memory device satisfies the access rate threshold comprises:

determining, by the circuitry of the memory device, a total duration for which the access rate of the memory device satisfies the access rate threshold, since a first initializing operation of the memory device, associated with a plurality of initializing operations.

6. The method of claim 1, wherein the initializing comprises:

powering on the memory device.

7. The method of claim 1, wherein the initializing comprises:

exiting an idle mode of the memory device.

8. The method of claim 1, further comprising:

determining, by the circuitry of the memory device, one or more conditions indicative of an exploit of the memory device; and storing, in a storage component of the memory device based at least in part on determining the one or more conditions indicative of the exploit, an exploit indicator associated with the stored indication of the cumulative duration for which the access rate of the memory device satisfies the access rate threshold.

9. The method of claim 1, further comprising:

storing, in the non-volatile storage component of the memory device and based at least in part on the initializing operation of the memory device, an indication of a quantity of initializing operations of the memory device.

10. The method of claim 1, further comprising:

receiving, by the circuitry of the memory device based at least in part on the initializing operation of the memory device, an indication of a date of operating the memory device; and storing, in a storage component of the memory device based at least in part on receiving the indication of the date of operating the memory device, a date associated with the stored indication of the cumulative duration for which the access rate of the memory device satisfies the access rate threshold.

11. The method of claim 1, wherein the cumulative duration for which the access rate of the memory device satisfies the access rate threshold is accumulated over multiple power cycles of the memory device.

12. A method, comprising:

initializing, by a host device, operation of a memory device that is coupled with the host device;

receiving, by the host device from the memory device and based at least in part on the initializing and a cumulative duration satisfying a duration threshold, an indication of the cumulative duration, since initialization of the operation of the memory device, for which an access rate of the memory device satisfies an access rate threshold; and performing an operation by the host device based at least in part on receiving the indication of the cumulative duration for which the access rate of the memory device satisfies the access rate threshold.

13. The method of claim 12, wherein receiving the indication of the cumulative duration for which the access rate of the memory device satisfies the access rate threshold comprises:

receiving, by the host device, an indication that the cumulative duration satisfies the duration threshold.

14. The method of claim 12, wherein performing the operation comprises:

transmitting, by the host device, an indication of a status of the memory device based at least in part on the indication of the cumulative duration for which the access rate of the memory device satisfies the access rate threshold.

15. The method of claim 12, wherein performing the operation comprises:

changing, by the host device, a parameter for operating the memory device based at least in part on the indication of the cumulative duration for which the access rate of the memory device satisfies the access rate threshold.

16. The method of claim 12, wherein the cumulative duration for which the access rate of the memory device satisfies the access rate threshold is accumulated over multiple power cycles of the memory device.

17. An apparatus, comprising:

an array of memory cells couplable to an interface with a processor or system-on-a-chip (SoC) and configured to operate in response to commands from the processor or the SoC;

logic attached to a same substrate as the array of memory cells and configured to determine a cumulative duration, since an initialization of the apparatus, of operating the array of memory cells for which an access rate of the apparatus satisfies an access rate threshold; and a non-volatile storage component, attached to the same substrate as the array of memory cells, coupled to the logic, and configured to store an indication of the cumulative duration based at least in part on the cumulative duration satisfying a duration threshold.

18. The apparatus of claim 17, wherein the logic is configured to:

receive a first clock signal from an oscillator of the apparatus, the first clock signal having a first frequency;

generate a second clock signal based at least in part on the first clock signal, the second clock signal having a second frequency that is lower than the first frequency; and count a quantity of cycles of the second clock signal, wherein determining the cumulative duration of operating the array of memory cells for which the access rate of the apparatus satisfies the access rate threshold is based at least in part on the quantity of cycles of the second clock signal.

19. The apparatus of claim 17, wherein, to determine the cumulative duration of operating the array of memory cells for which the access rate of the apparatus satisfies the access rate threshold, the logic is configured to:
- determine a total duration of operating the array of memory cells for which the access rate of the apparatus satisfies the access rate threshold, since a first initializing operation of the apparatus, associated with a plurality of initializing operations.

20. The apparatus of claim 17, wherein:
- the logic is configured to determine conditions indicative of an exploit of the apparatus; and
- the non-volatile storage component is configured to store, based at least in part on the logic determining the conditions indicative of the exploit, an exploit indicator associated with the cumulative duration for which the access rate of the apparatus satisfies the access rate threshold.

21. The apparatus of claim 17, wherein the array of memory cells comprises an array of volatile memory cells, wherein the non-volatile storage component is separate from the array of volatile memory cells, and wherein the array of memory cells comprises the non-volatile storage component.

22. The apparatus of claim 17, wherein the logic is configured to accumulate the cumulative duration for which the access rate of the apparatus satisfies the access rate threshold over multiple power cycles of the apparatus.

* * * * *